US011973019B2

(12) United States Patent
Choi et al.

(10) Patent No.: US 11,973,019 B2
(45) Date of Patent: Apr. 30, 2024

(54) DEEP TRENCH CAPACITORS IN AN INTER-LAYER MEDIUM ON AN INTERCONNECT LAYER OF AN INTEGRATED CIRCUIT DIE AND RELATED METHODS

(71) Applicant: QUALCOMM Incorporated, San Diego, CA (US)

(72) Inventors: Jihong Choi, San Diego, CA (US); Stanley Seungchul Song, San Diego, CA (US); Giridhar Nallapati, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 279 days.

(21) Appl. No.: 17/324,614

(22) Filed: May 19, 2021

(65) Prior Publication Data

US 2022/0375851 A1    Nov. 24, 2022

(51) Int. Cl.
*H01L 23/522* (2006.01)
*H01L 23/48* (2006.01)
(Continued)

(52) U.S. Cl.
CPC ........ *H01L 23/5223* (2013.01); *H01L 23/481* (2013.01); *H01L 23/5226* (2013.01);
(Continued)

(58) Field of Classification Search
CPC ............... H01L 23/5223; H01L 23/481; H01L 23/5226; H01L 23/5286; H01L 28/40;
(Continued)

(56) References Cited

U.S. PATENT DOCUMENTS 9,178,080 B2    11/2015  Kalnitsky et al.
9,472,690 B2    10/2016  Weng et al.
(Continued)

FOREIGN PATENT DOCUMENTS

WO    2018125060 A1    7/2018

OTHER PUBLICATIONS

CN 112151535 (Year: 2020).*
(Continued)

*Primary Examiner* — Patricia D Valenzuela
(74) *Attorney, Agent, or Firm* — QUALCOMM Incorporated

(57) ABSTRACT

Deep trench capacitors (DTCs) in an inter-layer medium (ILM) on an interconnect layer of an integrated circuit (IC) die is disclosed. A method of fabricating an IC die comprising DTCs in the ILM is also disclosed. The DTCs are disposed on an IC, in an ILM, to minimize the lengths of the power and ground traces coupling the DTCs to circuits in a semiconductor layer. The DTCs and the semiconductor layer are on opposite sides of the metal layer(s) used to interconnect the circuits, so the locations of the DTCs in the ILM can be independent of circuit layout and interconnect routing. IC dies with DTCs disposed in the ILM can significantly reduce voltage droop and spikes in IC dies in an IC stack. In one example, DTCs are also located in trenches in the substrate of the IC die.

22 Claims, 13 Drawing Sheets

(51) Int. Cl.
*H01L 23/528* (2006.01)
*H01L 49/02* (2006.01)
*H01L 23/00* (2006.01)
*H01L 23/31* (2006.01)
*H01L 23/538* (2006.01)

(52) U.S. Cl.
CPC .......... *H01L 23/5286* (2013.01); *H01L 28/40* (2013.01); *H01L 23/3128* (2013.01); *H01L 23/5383* (2013.01); *H01L 24/16* (2013.01); *H01L 2224/16146* (2013.01)

(58) Field of Classification Search
CPC ........... H01L 24/16; H01L 2224/16146; H01L 28/90; H01L 29/66181; H01L 29/945; H01L 23/3128; H01L 23/5383
See application file for complete search history.

(56) References Cited

U.S. PATENT DOCUMENTS

| | | |
|---|---|---|
| 9,691,684 B2 | 6/2017 | Park et al. |
| 2002/0192901 A1 | 12/2002 | Kimura et al. |
| 2014/0061855 A1 | 3/2014 | Kuo et al. |
| 2014/0145300 A1 | 5/2014 | Bhagavat et al. |
| 2015/0187777 A1 | 7/2015 | Hsu et al. |
| 2016/0020267 A1 | 1/2016 | Lin |
| 2018/0269276 A1 | 9/2018 | Lin et al. |
| 2020/0020635 A1* | 1/2020 | Chang ............... H01L 23/53257 |
| 2020/0273801 A1 | 8/2020 | Kim et al. |
| 2020/0294889 A1 | 9/2020 | Choi |
| 2020/0411636 A1 | 12/2020 | Kao et al. |
| 2021/0013303 A1 | 1/2021 | Chen et al. |
| 2022/0028825 A1* | 1/2022 | Jeng ..................... H01L 25/0652 |

OTHER PUBLICATIONS

International Search Report and Written Opinion for International Patent Application No. PCT/US2022/071787, dated Jul. 1, 2022, 14 pages.

* cited by examiner

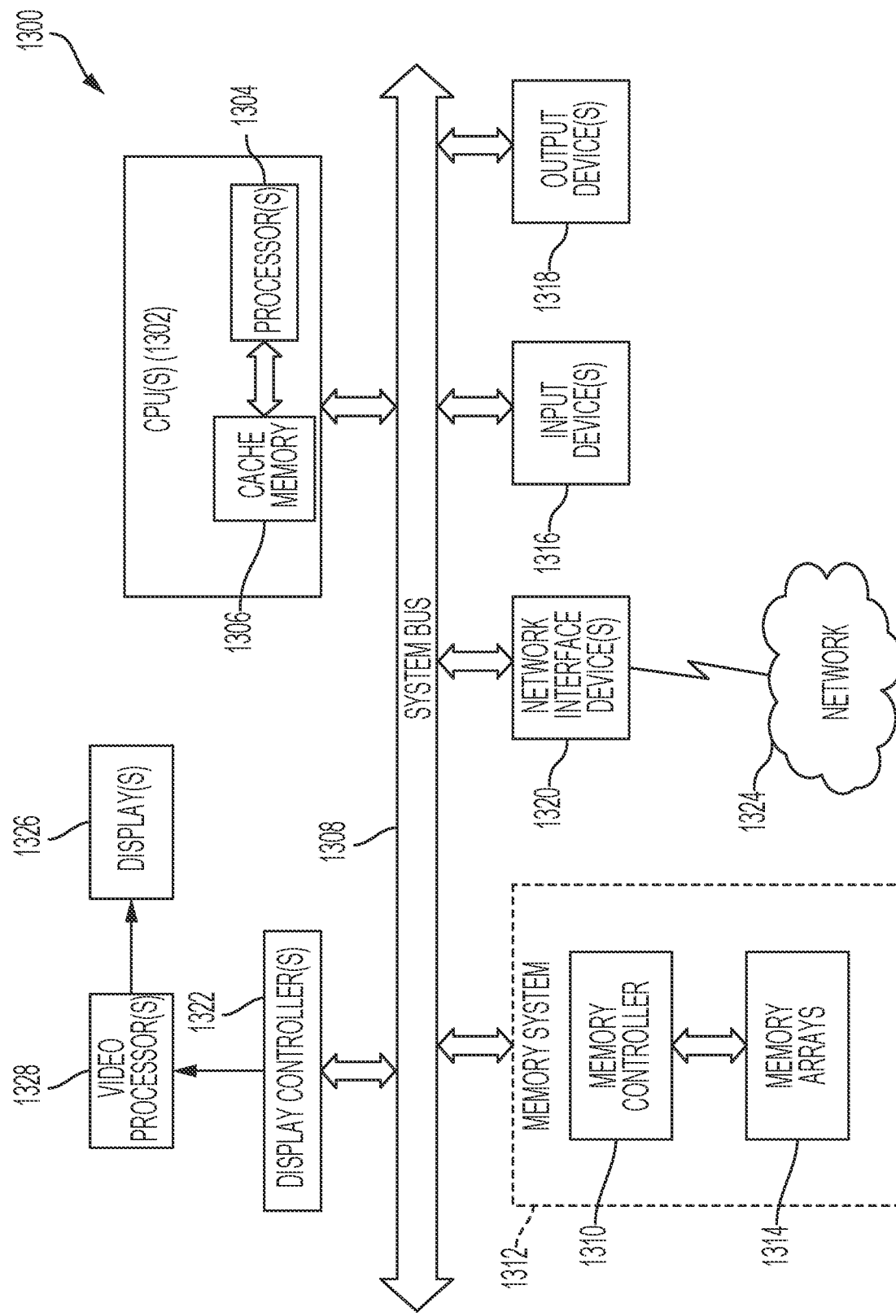

DEEP TRENCH CAPACITORS IN AN INTER-LAYER MEDIUM ON AN INTERCONNECT LAYER OF AN INTEGRATED CIRCUIT DIE AND RELATED METHODS

BACKGROUND

I. Field of the Disclosure

The field of the disclosure relates generally to integrated circuits and more particularly to decoupling capacitors in integrated circuit packages.

II. Background

Electronic devices trend toward being smaller in size as the functional capability and performance stays the same or increases. Integrated circuit (IC) chips that power an electronic device follow the same trend. The area occupied by multiple IC chips within the same device can be reduced by vertically stacking the IC chips rather than placing them side by side on the surface of a module or carrier substrate. An IC chip with high-frequency active circuits, such as a processor, may be placed at the top (i.e., on the outside) of the stack where heat can be more easily dissipated to avoid overheating. The current requirements of a processor can change quickly in response to processor activity. Sudden changes in current draw can cause voltage droops or spikes in the voltage supplied to processor. Voltage droops and spikes can cause circuit operation to temporarily fail and may cause permanent damage to the circuits.

The problem of voltage droops and spikes can be significantly reduced by employing decoupling capacitors connected between the power supply voltage (VDD) and ground voltage (VSS) connections. The effectiveness of decoupling capacitors is diminished by the effective series resistance (ESR) and effective series inductance (ESL) of the decoupling capacitors. Capacitors are ideally modeled as having no resistance or inductance. ESR and ESL are the resistance and inductance of a non-ideal capacitor ESR and ESL increase with the length of the conductors connecting the decoupling capacitors to the chip power and ground inputs. Therefore, it is important to place the decoupling capacitors as close to the IC chip as possible. On the surface of a module or carrier substrate, the decoupling capacitors can be placed in close proximity to each IC chip. However, in a chip stack, the bottom chip in the stack is attached to the module or carrier substrate and conductors extend up from the module surface, through the bottom chip, to provide power and ground voltage to the processor at the top of the stack. The length of the power and ground conductors between decoupling capacitors on the module surface and the processor at the top of the stack increases voltage droop and spikes in the processor. Thus, there is a need to locate the decoupling capacitors closer to each IC chip in a stack.

SUMMARY OF THE DISCLOSURE

Aspects disclosed herein include deep trench capacitors (DTCs) in an inter-layer medium (ILM) on an interconnect layer of an integrated circuit (IC) die is disclosed. A method of fabricating an IC die comprising DTCs in the ILM is also disclosed. DTCs are coupled to the power and ground connections of an IC die to reduce power supply voltage droops and spikes that occur in response to changes in load current and noise. The decoupling capability of DTCs is reduced by higher effective series resistance (ESR) and effective series inductance (ESL). ESR and ESL are parasitic electrical characteristics of a capacitor. ESR and ESL both increase with increased lengths of power and ground traces connecting the DTCs to power and ground circuits of the IC. In an exemplary aspect, the DTCs are disposed on an IC, in an ILM, to minimize the lengths of the power and ground traces coupling the DTCs to circuits in a semiconductor layer. The DTCs and the semiconductor layer are on opposite sides of the metal layer(s) used to interconnect the circuits, so the locations of the DTCs in the ILM are independent of circuit layout and interconnect routing. IC dies with DTCs disposed in the ILM can significantly reduce voltage droop and spikes in IC dies in an IC stack.

In an exemplary aspect, an IC die is disclosed. The IC die comprises a semiconductor layer on a substrate, a plurality of circuits in the semiconductor layer; an ILM, and a plurality of metal layers disposed between the semiconductor layer and the ILM. The plurality of metal layers comprises horizontal metal traces interconnecting circuits of the plurality of circuits. The IC die further comprises a plurality of interconnects extending through the ILM and coupled to the horizontal metal traces; and at least one DTC disposed in the ILM, each of the at least one DTC comprising a first terminal coupled to a first vertical interconnect among the plurality of interconnects and a second terminal coupled to a second vertical interconnect among the plurality of interconnects.

In another exemplary aspect, a method of fabricating an IC die is disclosed. The method comprises forming circuits in a semiconductor layer on a substrate, forming at least one metal layer including horizontal metal traces interconnecting the circuits, forming an ILM on the at least one metal layer, forming a plurality of interconnects that extend through the ILM and coupled to the at least one metal layer. The method further comprises forming a DTC in the ILM. Forming the DTC comprises forming at least one trench in the ILM, forming a first metal plate on side surfaces and a bottom surface of the at least one trench, the first metal plate coupled to a first one of the plurality of interconnects, forming a dielectric layer on the first metal plate, and forming a second metal plate on the dielectric layer, the second metal plate coupled to a second one of the plurality of interconnects.

In another exemplary aspect, an IC package comprising an IC die, a second die, a package power contact, and a package ground contact is disclosed. The IC die comprises a semiconductor layer on a substrate, a plurality of circuits in the semiconductor layer; an ILM, and a plurality of metal layers disposed between the semiconductor layer and the ILM. The plurality of metal layers comprises horizontal metal traces configured to interconnect circuits of the plurality of circuits. The IC die further comprises a plurality of interconnects extending vertically through the ILM and coupled to the horizontal metal traces; and at least one DTC disposed in the ILM, each of the at least one DTC comprising a first terminal coupled to a first vertical interconnect among the plurality of interconnects and a second terminal coupled to a second vertical interconnect among the plurality of interconnects. The second die includes a substrate and a plurality of through-silicon-vias (TSVs) extending through the substrate. The plurality of TSVs are configured to couple the first vertical interconnect to the package power contact and couple the second vertical interconnect to the package ground contact.

BRIEF DESCRIPTION OF THE FIGURES

FIG. 13 is a block diagram of an exemplary IC package including exemplary IC dies including DTCs disposed in an ILM for reduced voltage droops and spikes as illustrated in FIGS. 3, 4, and 7-9, and according to any of the aspects disclosed herein.

DETAILED DESCRIPTION

Figure 1:
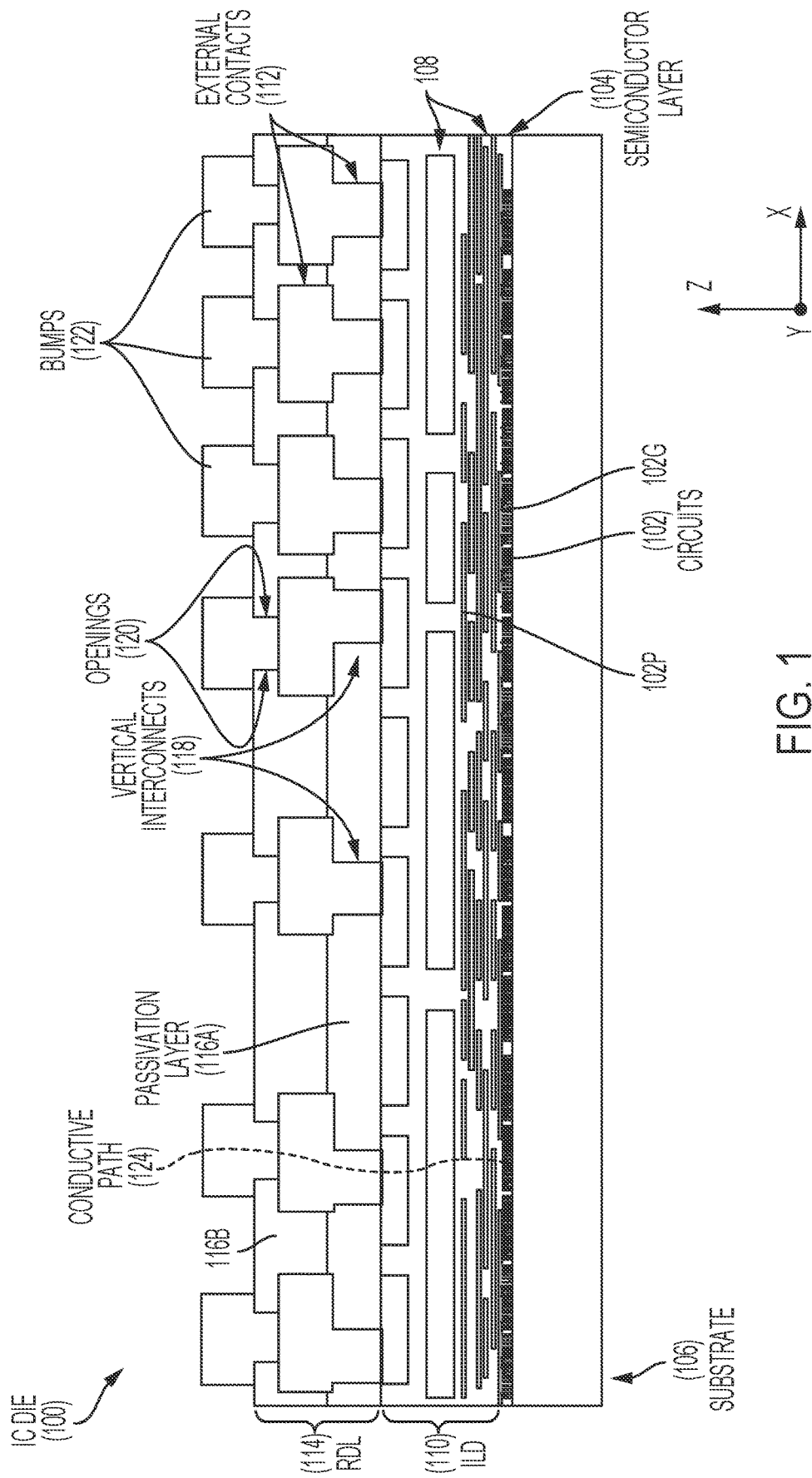
FIG. 1 is an illustration of a cross-sectional side view of an integrated circuit (IC) die configured to be included in a die stack.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include deep trench capacitors (DTCs) in an inter-layer medium (ILM) on an interconnect layer of an integrated circuit (IC) die is disclosed. A method of fabricating an IC die comprising DTCs in the ILM is also disclosed. DTCs are coupled to the power and ground connections of an IC die to reduce power supply voltage droops and spikes that occur in response to changes in load current and noise. The decoupling capability of DTCs is reduced by higher effective series resistance (ESR) and effective series inductance (ESL). ESR and ESL are parasitic electrical characteristics of a capacitor. ESR and ESL both increase with increased lengths of power and ground traces connecting the DTCs to power and ground circuits of the IC. In an exemplary aspect, the DTCs are disposed on an IC, in an ILM, to minimize the lengths of the power and ground traces coupling the DTCs to circuits in a semiconductor layer. The DTCs and the semiconductor layer are on opposite sides of the metal layer(s) used to interconnect the circuits, so the locations of the DTCs in the ILM are independent of circuit layout and interconnect routing. IC dies with DTCs disposed in the ILM can significantly reduce voltage droop and spikes in IC dies in an IC stack.

FIG. 1 is an illustration of a cross-sectional side view of an IC die 100 configured to be included in a die stack. The IC die 100 includes circuits 102 formed in a semiconductor layer 104 on a substrate 106. The circuits 102 are interconnected by horizontal metal traces 108 disposed in an inter-layer dielectric (ILD) 110. The circuits 102 include power circuits 102P and ground circuits 102G. The horizontal metal traces 108 also couple the circuits 102 to external contacts 112. The external contacts 112 are disposed in a redistribution layer (RDL) 114 including passivation layers 116A and 116B. The passivation layer 116A includes vertical interconnects 118 coupling the horizontal metal traces 108 to the external contacts 112. The passivation layer 116B includes openings 120 where bumps 122 are formed on the external contacts 112. The bumps 122 are employed to electrically couple the external contacts 112 in the IC die 100 to external circuits (not shown). The bumps 122 can be used to couple the IC die 100 to another die in a stack or to a surface of a module or chip carrier, for example. As discussed above, decoupling capacitors (not shown) are needed to reduce voltage droop. However, decoupling capacitors coupled to the IC die 100 would be located outside the IC die 100 beyond the bumps 122. The decoupling capacitors would couple to the power and ground circuits 102P, 102G in the IC die 100 through the bumps 122, external contacts 112, vertical interconnects 118, and horizontal metal traces 108. A conductive path 124 from the bumps 122 to the power and ground circuits 102P, 102G would have resistance and inductance that would increase the ESR and ESL of external decoupling capacitors. This problem would be exaggerated in a stack of IC dies with the decoupling capacitors located on a surface to which the stacked is connected. Thus, the IC die 100 may have voltage droop and voltage spikes due to changes in load current when activity levels suddenly change within the circuits 102. For this reason, it could be beneficial to locate decoupling capacitors on the IC die 100.

Figure 2:
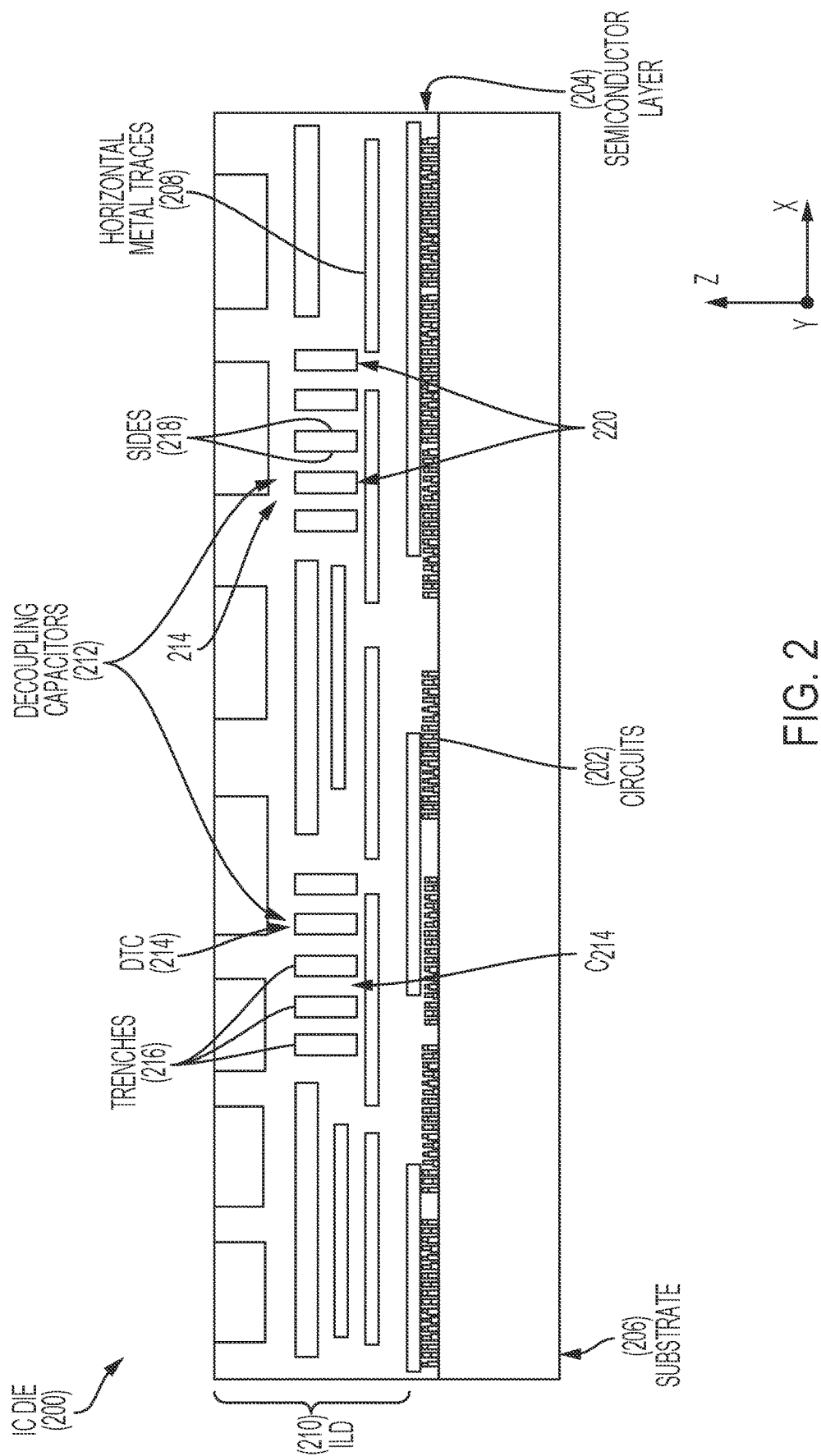
FIG. 2 is an illustration of a cross-sectional side view of an IC die including deep trench capacitors (DTCs) disposed among horizontal metal traces in metal layers.

FIG. 2 is an IC die 200 including circuits 202 formed in a semiconductor layer 204 on a substrate 206. The circuits 202 are interconnected by horizontal metal traces 208 disposed in an ILD 210. The IC die 200 illustrates one option for including decoupling capacitors 212 on an IC die 200. The decoupling capacitors 212 are DTCs 214 formed in the ILD 210. DTCs 214 are formed in trenches 216. The sides 218 and bottom 220 of the trenches 216 provide a combined total surface area that is directly related to a capacitance $C_{214}$ of the DTCs 214. However, the DTCs 214 occupy volume in ILD 210 that would otherwise be available for routing the horizontal metal traces 208. As a result, there is a compromise between the number and location of DTCs 214 disposed in the ILD 210 and the routing density and area of the IC die 200.

Figure 3:
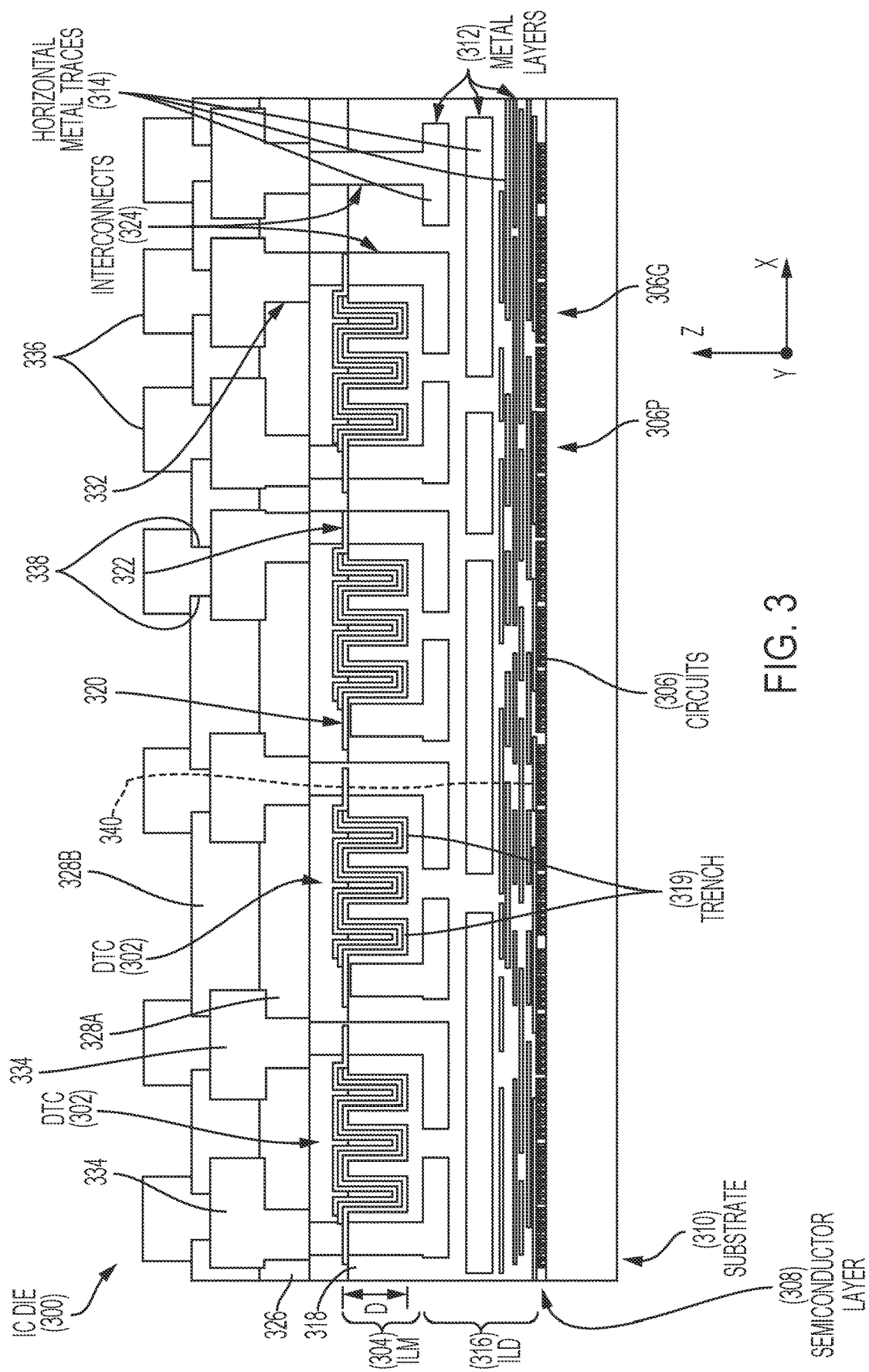
FIG. 3 is an illustration of a cross-sectional side view of an exemplary IC die including DTCs disposed in an inter-layer material (ILM) on a first side of metal layers including horizontal metal traces and coupled to circuits in a semiconductor layer on a second side of the metal layers for reducing voltage droops and spikes.

FIG. 3 is an illustration of a cross-sectional side view of an exemplary IC die 300 including at least one DTC 302 disposed in an ILM 304 to reduce voltage droop and spikes in a plurality of circuits 306. Voltage droop and voltage spikes may occur in IC dies in response to sudden changes in load current and/or noise in the power supply. Sudden changes of load current may correspond to changes in activity within the IC die 300, such as activity in a processor or other active circuits (not shown) among the plurality of circuits 306. The plurality of circuits 306 are formed in a semiconductor layer 308 on a substrate 310. The plurality of circuits 306 include power circuits 306P and ground circuits 306G. Power circuits 306P provide a supply voltage (VDD) (e.g., 1.8 volts (V)) to the circuits 306, and the ground circuits 306G provide a ground voltage (VSS) (e.g., 0 V) to the circuits 306. The circuits 306 may include transistors (not shown) formed in the semiconductor layer 308. The IC die 300 also includes a plurality of metal layers 312 disposed between the semiconductor layer 308 and the ILM 304. The metal layers 312 may be one or more metal layers 312 that include horizontal metal traces 314 interconnecting the circuits 306. In this regard, the metal layers 312 may also be referred to as interconnect layers 312. The horizontal metal traces 314 are disposed in and separated from each other by an ILD 316. In the IC die 300 shown in FIG. 3, with the substrate 310 oriented horizontally (e.g., extending in the X-axis direction), the ILM 304 is above or on an upper side of the metal layers 312 in the Z-axis direction, and the semiconductor layer 308 is below or on a lower side of the metal layers 312 in the Z-axis direction. A total thickness of the circuits 306 disposed in the semiconductor layer 308 and the ILD 316 including the metal layers 312 may be 1.5 micron (μm) to 2 μm. Thus, the ILM 304 including the DTCs 302 are at least 1.5 μm away (e.g., in the Z-axis direction) from the substrate 310.

The ILM 304 is a dielectric material 318, an insulating layer, a passivation layer, or a protective material, for example. The ILM 304 may be formed of the same type of dielectric material 318 as the ILD 316, for example. The DTCs 302 are disposed in trenches 319 having a depth D in the ILM 304 in locations that are independent of locations of the circuits 306. The trenches 319 may be formed by etching or other known processes. The trenches have a depth in a range of 3 μm to 5 μm, a width in a range of 0.2 μm to 0.4 μm, and a length in a range of 3 μm to 5 μm, or longer. The DTCs 302 may formed in a plurality of the trenches 319. In one example, one of the DTCs 302 may be formed in at least 1 and up to 10 trenches 319. In another example, one of the DTCs 302 may be formed in at least one trench 319. In another example, multiple DTCs 302 may be electrically coupled to form a larger capacitor. Each of the DTCs 302 includes a first terminal 320 and a second terminal 322. In one example, the first terminal 320 is coupled to a first one of a plurality of interconnects 324 that extend in the Z-axis direction (e.g., vertical in FIG. 3) through the ILM 304. The second terminal 322 is coupled to a second one of the plurality of interconnects 324. The interconnects 324 are coupled to the horizontal metal traces 314 that can connect the DTCs 302 to the power and ground circuits 306P and 306G. It should be understood that vias (not shown) extend between the horizontal metal traces 314 and couple the horizontal metal traces 314 to the circuits 306.

The IC die 300 also includes an upper ILM 326 disposed on the ILM 304, and passivation layers 328A and 328B disposed on the upper ILM 326. A thickness of the ILM 304 and the upper ILM 326 is 6 μm to 10 μm. Interconnects 330 that extend through the upper ILM 326 and couple to the interconnects 324. Interconnects 332 extend through the passivation layer 328A to couple the interconnects 330 to external contacts 334 disposed in the passivation layer 328B. Bumps 336 are formed on the external contacts 334 in openings 338 in the passivation layer 328B. The power and ground circuits 306P, 306G are coupled to the bumps 336 by a conductive path 340 that includes the external contacts 334, the interconnects 332, the interconnects 330, the interconnects 324, and the horizontal metal traces 314 (and vias not shown).

As noted above, the effectiveness of decoupling capacitors is reduced by the ESR and ESL of the conductors between the capacitors and the power and ground circuits. The only the portion of the conductive path 340 that contributes ESR and ESL in the IC die 300 includes the interconnects 324, which are coupled to the DTCs 302, and the horizontal metal traces 314.

Referring back to FIG. 1 for comparison, the decoupling capacitors are not located on the IC die 100. Thus, the entire conductive path 124 through the IC die 100 would contribute to the ESR and ESL associated with external decoupling capacitors, in addition to any external connections from the bumps 122 to the external decoupling capacitors. Thus, with further reference to FIG. 3, locating the DTCs 302 in the ILM 304 on the IC die 300 can significantly reduce voltage droop and voltage spikes.

Additionally, the at least one DTC 302 can be located anywhere in the ILM 304 without interfering with the placement of circuits 306 or the horizontal metal traces 314. In this regard, the ILM 304 and DTCs 302 may be added onto an IC die having any previously existing design to reduce voltage droops and spikes without increasing the size of the IC die.

Figure 4:
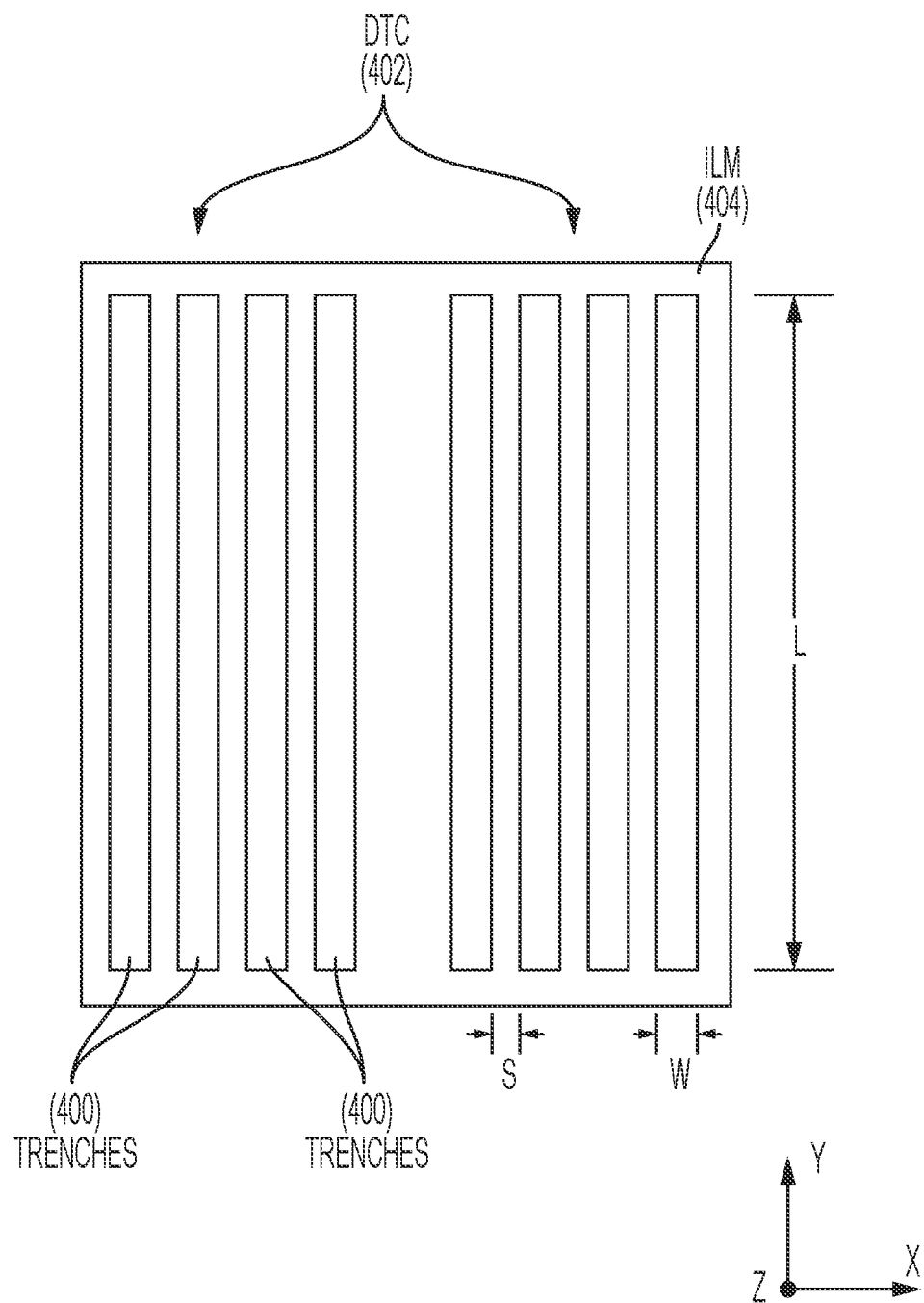
FIG. 4 is an illustration of a cross-sectional top view of DTCs disposed in an ILM such as the DTCs in the IC die in FIG. 3.

FIG. 4 is a cross-sectional top view of trenches 400 in which DTCs 402 are formed in an ILM 404. The DTCs 402 in FIG. 4 each include four (4) of the trenches 400 but may include any number from one to ten trenches, for example. The number of trenches 400 included in each of the DTCs 402 depends on a desired capacitance, which increases with the number of trenches 400. The trenches 400 in FIG. 4 have width W extending in the X-axis direction and a length L extending in the Y-axis direction. As an example, the length L may be in a range of 3 μm to 5 μm and the width W may be in a range of 0.2 μm to 0.4 μm. The trenches 400 may also have a depth D (see FIG. 3) in the ILM in the Z-axis direction in a range of 3 μm to 5 μm. A separation distance S between the trenches 400 in the X-axis direction in a range of 0.2 μm to 0.4 μm or more.

Figure 5:
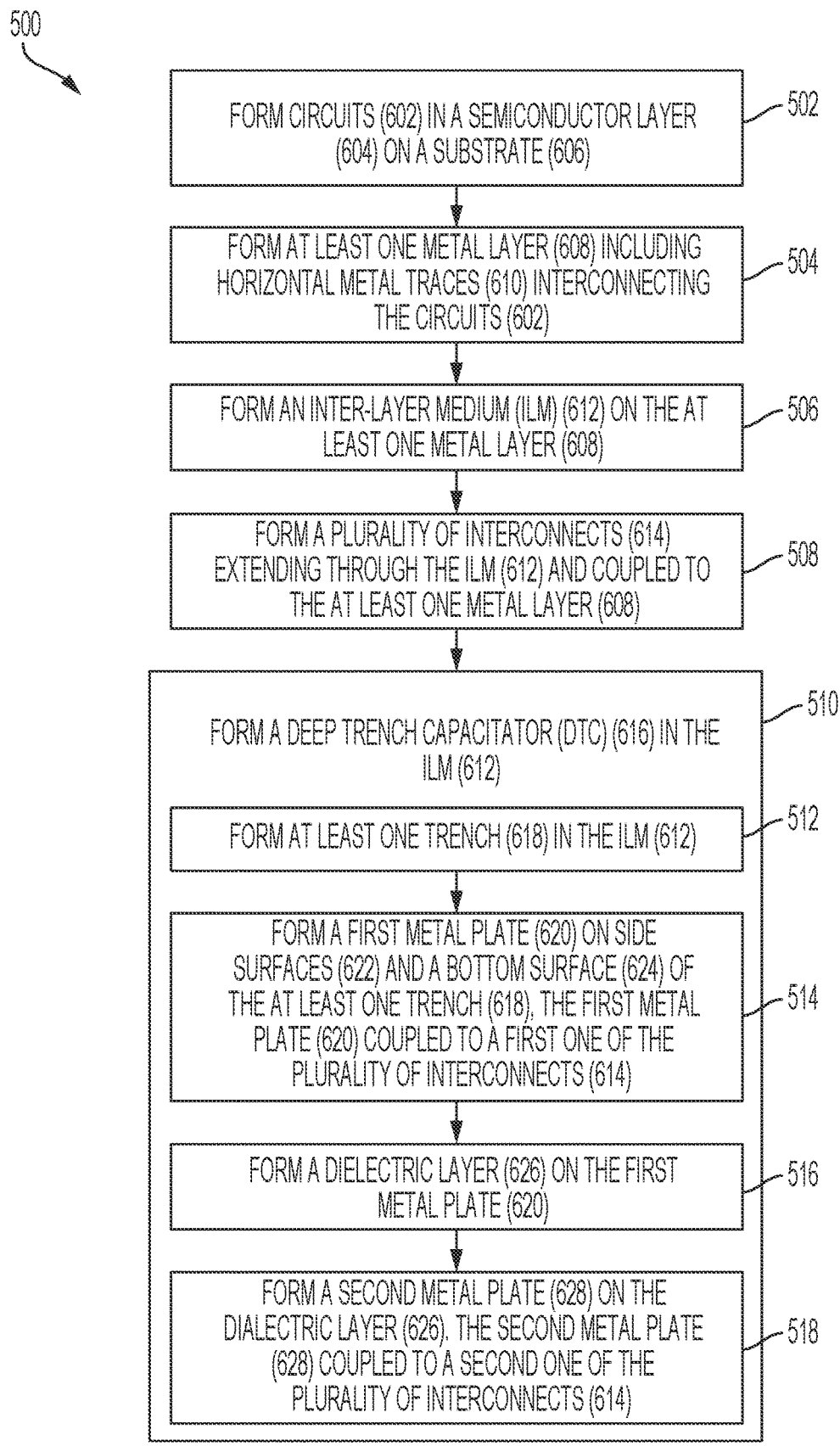
FIG. 5 is a flow chart illustrating an exemplary method of fabricating the IC die in FIG. 3 with reference to the stages of fabrication illustrated in FIGS. 6A-6E.
Figure 6A:
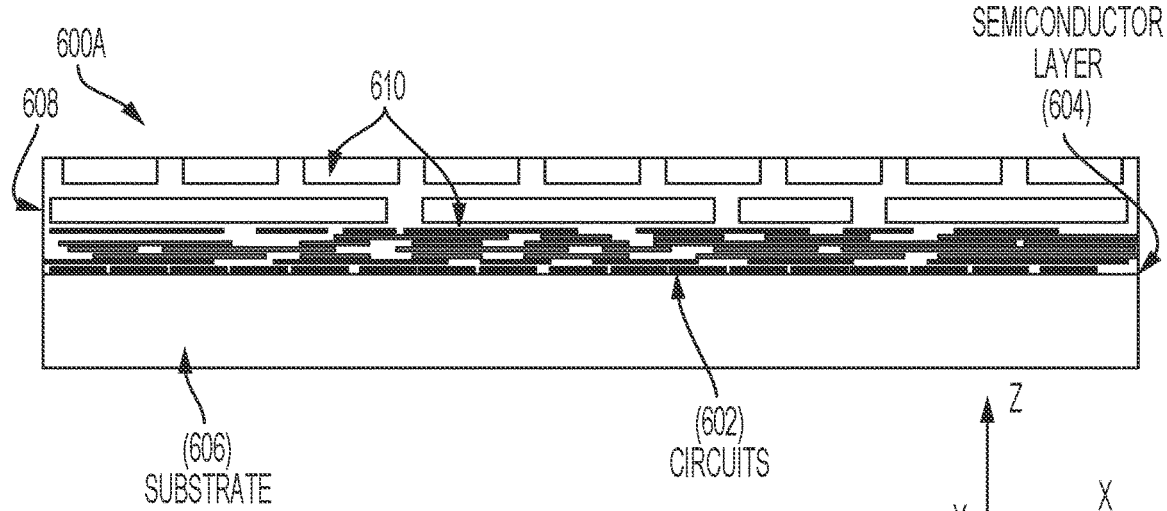
FIGS. 6A-6E illustrate cross-sectional side views of the IC die in FIG. 3 at stages of fabrication according to the method illustrated in FIG. 5.
Figure 6B:
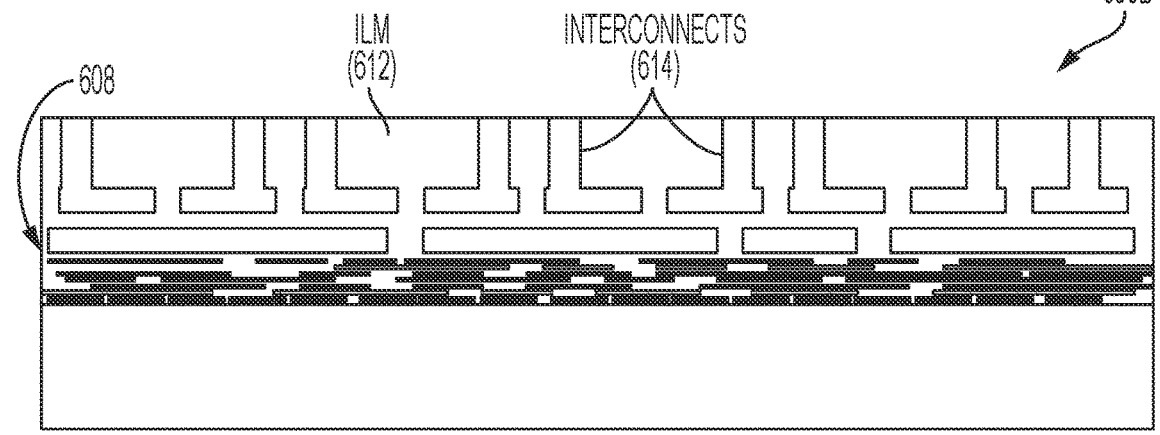
Figure 6C:
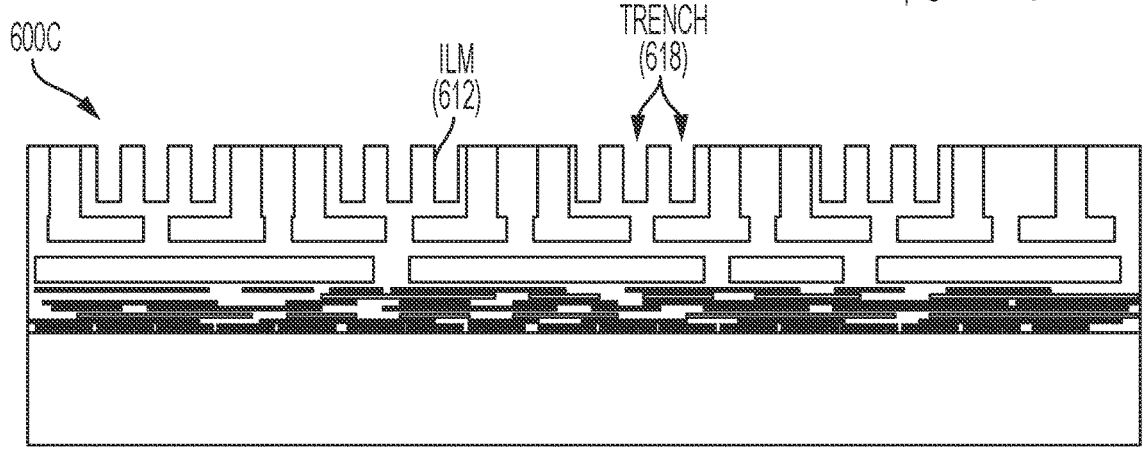
Figure 6D:
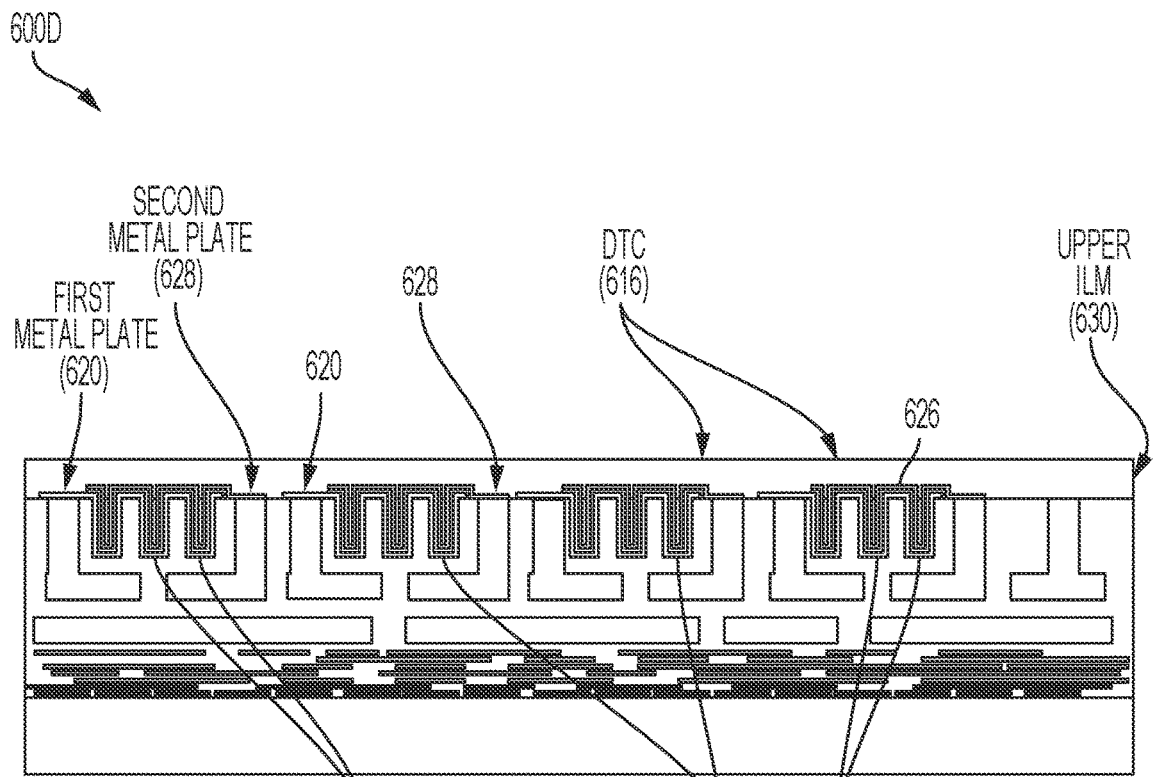
Figure 6E:
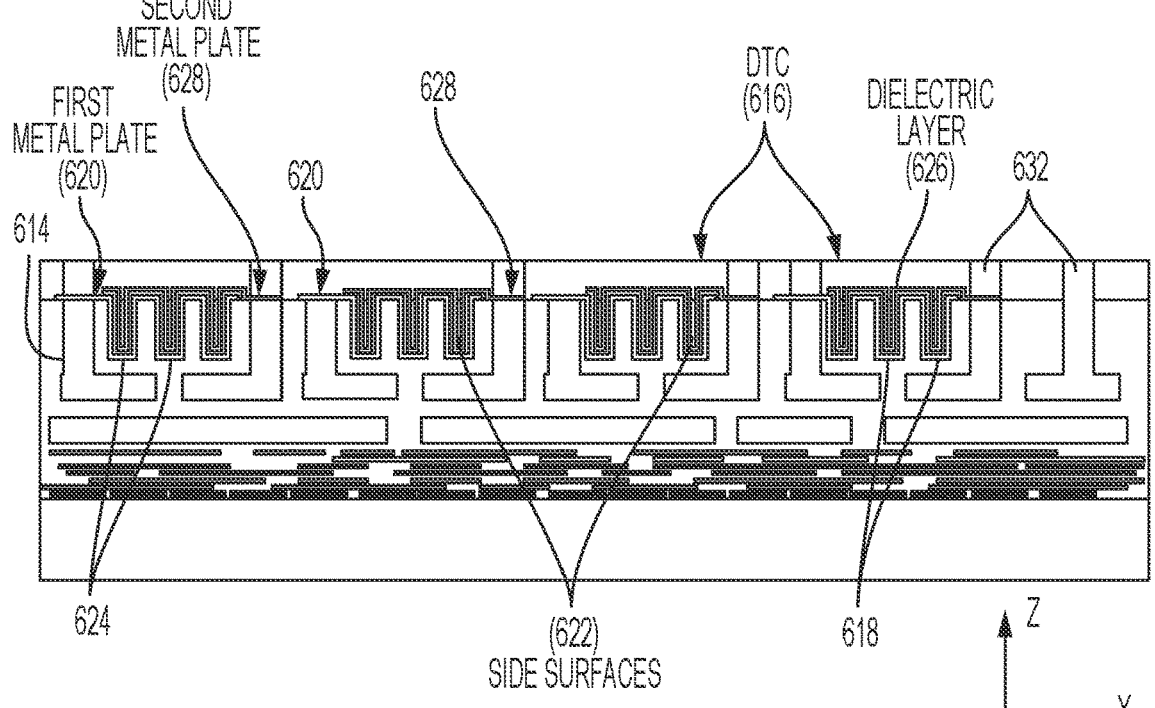

FIG. 5 is a flow chart of a method 500 of fabricating the IC die 300 in FIG. 3 including the DTCs 302 in the ILM 304. The method 500 is described with reference to the illustrations of fabrication stages 600A-600E in FIGS. 6A-6E. The method 500 includes forming circuits (602) in a semiconductor layer (604) on a substrate (606)(block 502) and forming at least one metal layer (608) including horizontal metal traces (610) interconnecting the circuits (602) (block 504) as shown in fabrication stage 600A in FIG. 6A. The method includes forming an ILM (612) on the at least one metal layer (608) (block 506) and forming a plurality of interconnects (614) extending through the ILM (612) and coupled to the at least one metal layer (608) (block 508), as shown in fabrication stage 600B in FIG. 6B. The method further includes forming a DTC (616) (see FIG. 6D) in the ILM (612) (block 510), as shown in the fabrication stage 600C in FIG. 6C. The method of forming the DTC (616) in the ILM (612) includes forming at least one trench (618)(see FIG. 6C) in the ILM (612)(block 512) and forming a first metal plate (620) on side surfaces (622) and a bottom surface (624) of the at least one trench (618), the first metal plate (620) coupled to a first one of the plurality of interconnects (614) (block 514) as shown in FIG. 6D. The method of forming the DTC (616) also includes forming a dielectric layer (626) on the first metal plate (620) (block 516) and forming a second metal plate (628) on the dielectric layer (626), the second metal plate (628) coupled to a second one of the plurality of interconnects (614)(block 518). In some examples, the method may further include forming an upper ILM (630) on the ILM (612), as shown in the fabrication stage 600D in FIG. 6D, and forming interconnects (632) through the upper ILM (630), the interconnects (632) coupled to the plurality of interconnects (614), as shown in the fabrication stage 600E in FIG. 6E. Capacitors are often formed as parallel plates separated by a dielectric material. The term "metal plate" as used herein refers to a metal layer on one side of a dielectric material to form a capacitor. The first metal plate 620 and the second metal plate 628 may be disposed on flat surfaces, such as the side surfaces 622 and the bottom surface 624 of the at least one trench 618. The metal plates 620 and 628 may be contoured to also extend over corners of surfaces from a side surface 622 to a bottom surface 624 and onto the semiconductor layer 604 or substrate 606 between the at least one trenches 618. Thus, the term "metal plate" is not limited to an entirely flat surface.

Figure 7:
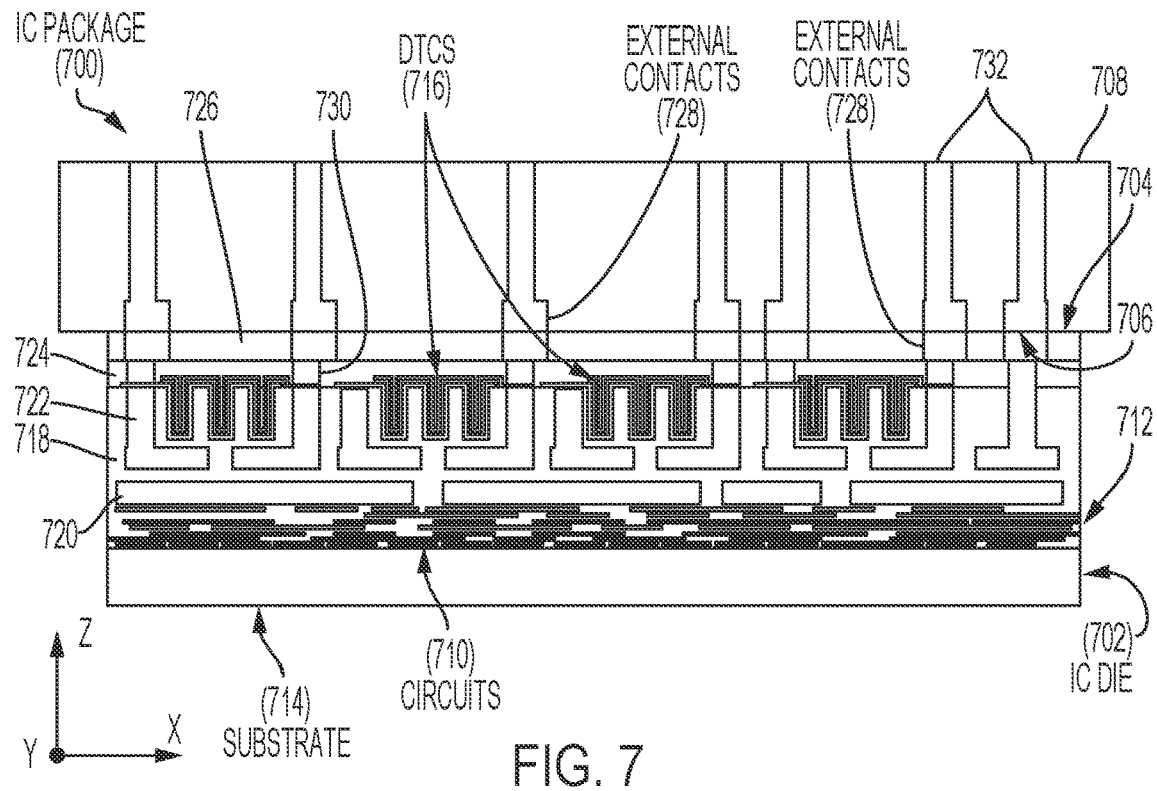
FIG. 7 is an illustration of a cross-sectional side view of an IC die stack including the IC die in FIG. 3 surface-bonded to a substrate including through-silicon-vias (TSVs)

FIG. 7 is an illustration of an IC package 700 including an IC die 702 with a surface 704 that is bonded to a surface 706 of a substrate 708, which may also be referred to as an interposer substrate 708. The IC die 702 includes circuits 710 formed on a semiconductor layer 712 of a substrate 714. The IC die 702 also includes DTCs 716 disposed in an ILM 718. The IC die 702 includes metal layers 720 between the ILM 718 and the semiconductor layer 712. The ILM 718 also includes interconnects 722 extending through the ILM 718 and coupled to the metal layers 720. The IC die 702 includes an upper ILM 724 disposed on the ILM 718 and a passivation layer 726 on the upper ILM 724. External contacts 728 are disposed in the passivation layer 726. Interconnects 730 extend through the upper ILM 724 from the interconnects 722 to the external contacts 728. The surface 704 of the IC die 702 includes the upper ILM 724 and the external contacts 728. The external contacts 728 couple to through-silicon-vias (TSVs) 732 that extend through the interposer substrate 708 and are configured to couple the external contacts 728 to contacts on a module, a chip carrier, or another die in a die stack (not shown). The interposer substrate 708 may be an IC die including active circuits, a carrier substrate provided only for connectivity, or any other type of chip or die disposed between the IC die 702 and a module, a chip carrier, or another die in the IC package 700. The IC die 702 is configured to be coupled to an external source of a VDD and a VSS through the interposer substrate 708.

Figure 8:
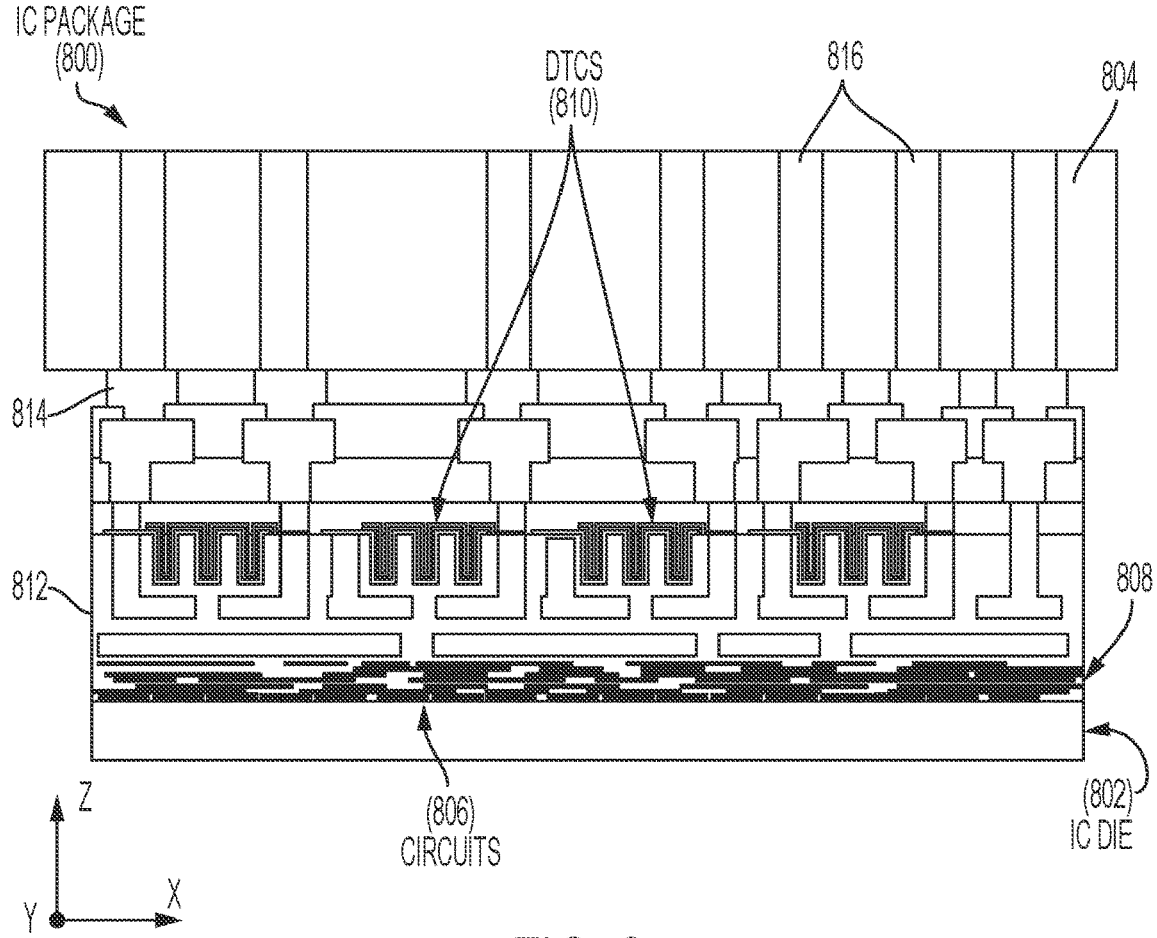
FIG. 8 is an illustration of a cross-sectional side view of an IC die stack including the IC die in FIG. 3 bump-bonded to a substrate including TSVs.

FIG. 8 is illustration of an IC package 800 including an IC die 802 corresponding to the IC die 300 in FIG. 3 coupled to an interposer substrate 804. The IC die 802 includes circuits 806 on a semiconductor layer 808 and DTCs 810 in an ILM 812. The IC package 800 includes solder bumps 814 configured to couple the IC die 802 to TSVs 816 in the interposer substrate 804. The circuits 806 in the IC die 802 are coupled to an external source of a VDD and a VSS through the TSVs 816.

In the IC packages 700 and 800, the DTCs 716 and 810 are on the IC dies 702 and 802, respectively, close to the circuits 710 and 806 to reduce voltage droops or spikes in the event of sudden changes in load current. The DTCs 716 and 810 can provide better decoupling than capacitors external to the IC packages 700 and 800 because they avoid the ESR and ESL contributed by conductors coupling the IC dies 702 and 802 to external power and ground voltage sources.

Figure 9:
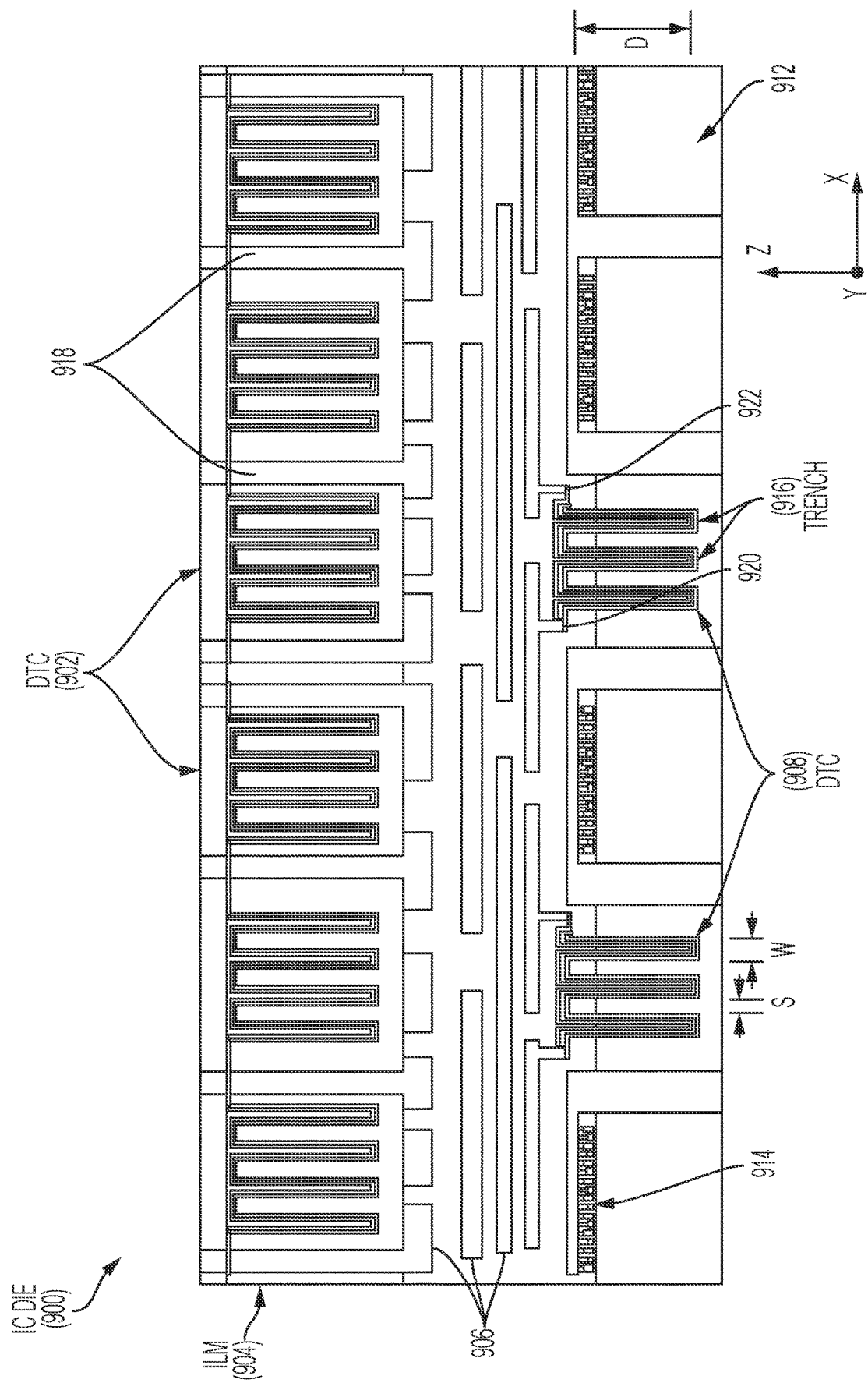
FIG. 9 is an illustration of a cross-sectional side view of an IC die including DTCs disposed in an ILM on a first side of metal layers and DTCs disposed among circuits in a semiconductor layer on a second side of the metal layers for reducing voltage droops and spikes.

FIG. 9 is an illustration of a cross-sectional side view of an IC die 900 including DTCs 902 disposed in an ILM 904 on a first side of metal layers 906 and DTCs 908 disposed on a second side of the metal layers 906. The DTCs 908 are formed in a semiconductor layer 910 and in a substrate 912 on which the semiconductor layer 910 is formed. Circuits 914 of the IC die 900 are formed in the semiconductor layer 910. The DTCs 908 are located in areas that do not include the circuits 914. The DTCs 908 are formed in trenches 916 that extend through the semiconductor layer 910 and into the substrate 912. The trenches 916 have a depth D of 3 μm to 5 μm. The trenches 916 have a width W in a range of 0.2 μm to 0.4 μm and a length L extending in the Y-axis direction (not visible in the perspective shown) in a range of 3 μm to 5 μm. The trenches 916 are separated from each other by a separation distance S of 0.2 μm to 0.4 μm. The above dimensions are exemplary and the trenches 916 are not limited in this regard.

Both the DTCs 902 in the ILM 904 and the DTCs 908 in the semiconductor layer 910 are coupled to the circuits 914 as decoupling capacitors for reducing voltage droops and spikes. The DTCs 902 correspond to the DTCs 716 and 810 in FIGS. 7 and 8, respectively, and couple to the metal layers 906 through interconnects 918 in the ILM 904. The DTCs 908 include first terminals 920 and second terminals 922 that are both coupled to the metal layers 906. The DTCs 908 provide additional decoupling capacitance in areas of the IC die 900 not occupied by the circuits 914.

Figure 10:
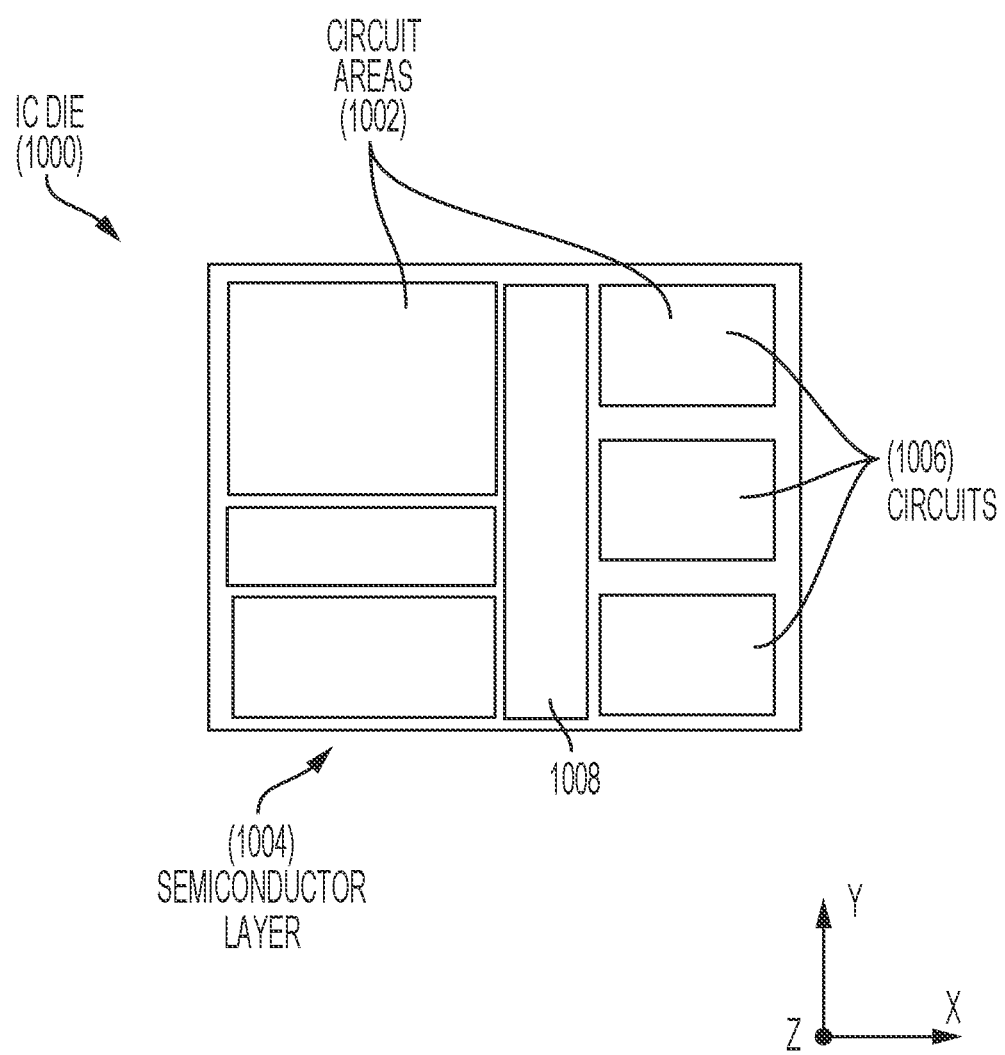
FIG. 10 is a cross-sectional top view of an IC die illustrating circuit areas in the semiconductor layer in which the DTCs in FIG. 9 can be disposed.

FIG. 10 is a cross-sectional top view of an IC die 1000 illustrating circuit areas 1002 of a semiconductor layer 1004 in which the DTCs 908 in FIG. 9 may be disposed. The circuit areas 1002 are areas of circuits 1006 located in close proximity to each other for purposes of timing optimization and area efficiency. Each of the circuit areas 1002 performs one or more functional capabilities of the IC die 1000. As the DTCs 908 of the IC die 900 are disposed in the semiconductor layer 910 among the circuits 914, the IC die 1000 also includes non-circuit areas 1008 in which no transistors or other circuits are formed. The non-circuit areas 1008 provide locations for including DTCs such as the DTCs 908 of FIG. 9 to increase the total decoupling capacitance provided on the IC die 1000. Referring back to FIG. 9, the DTCs 902, may also be disposed in the ILM 904 on the circuit areas 1002 as well as the non-circuit areas 1008. Also, the DTCs 902 are disposed above the metal layers 906 and, therefore, may be located independent of the circuit areas 1002 and the metal layers 906.

Figure 11A:
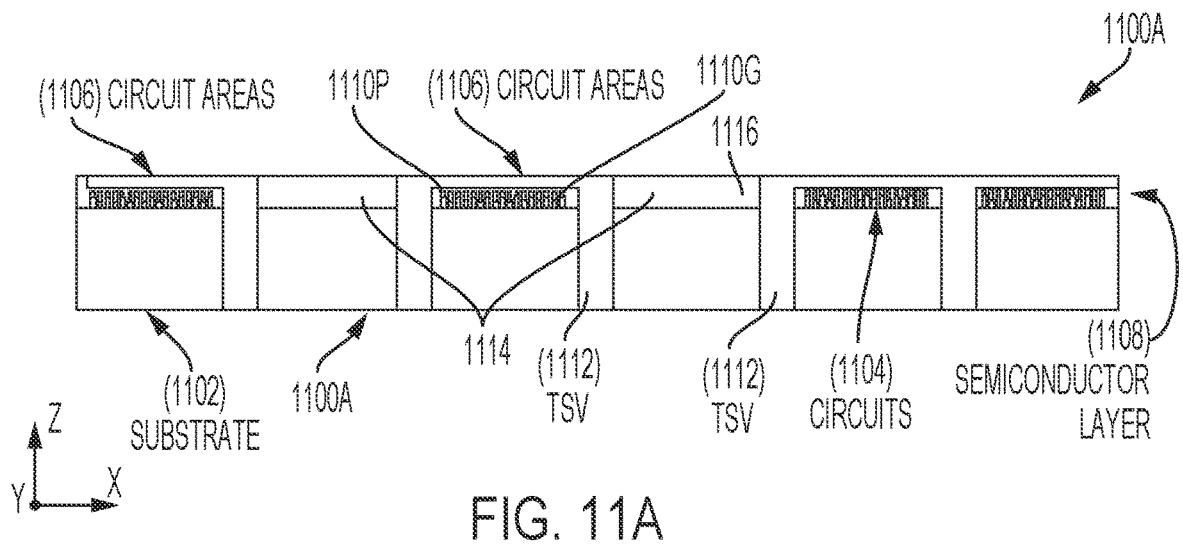
FIGS. 11A-11C illustrate cross-sectional side views of the IC die in FIG. 10 at stages of fabrication.
Figure 11B:
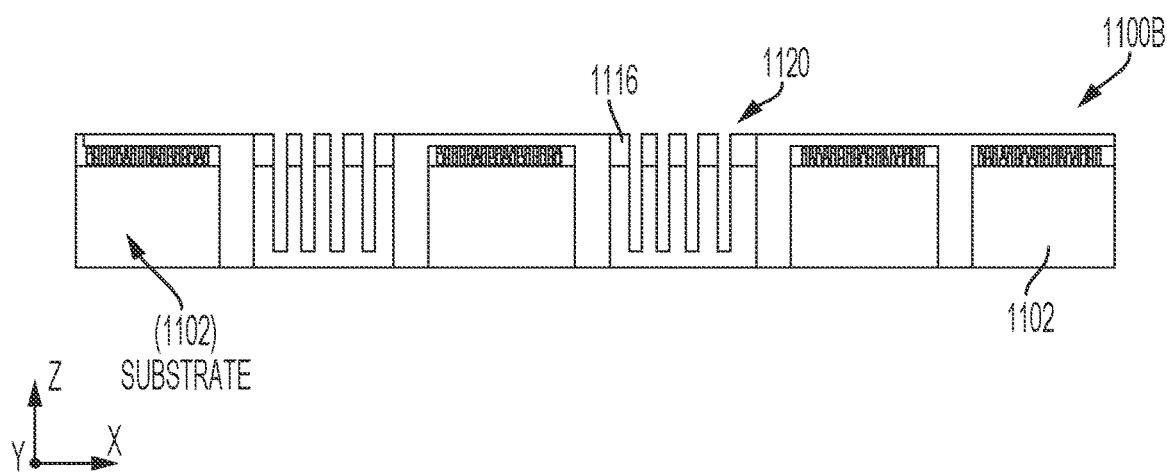
Figure 11C:
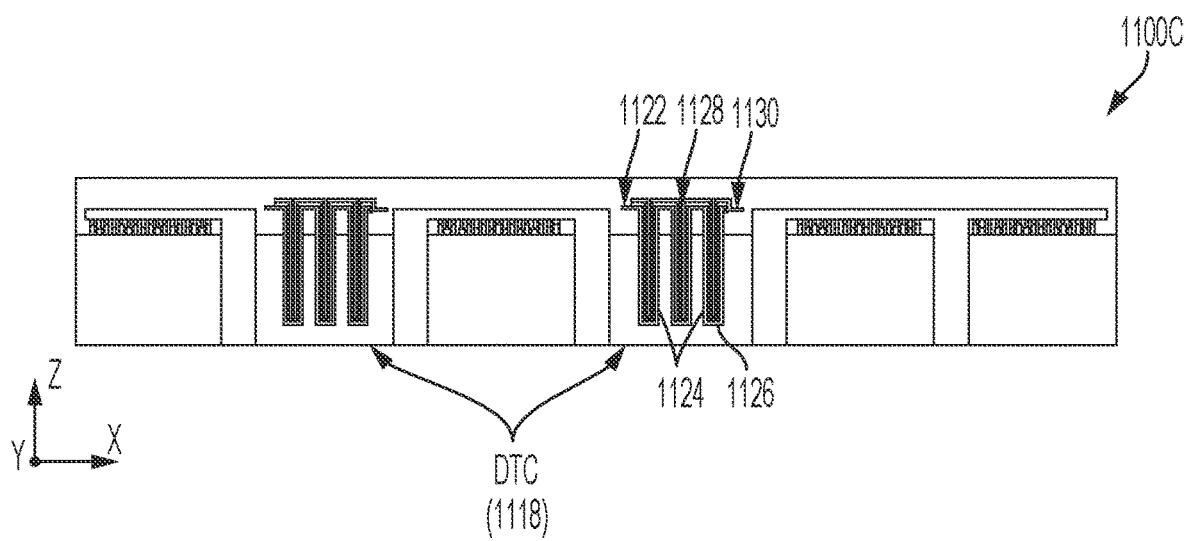

FIGS. 11A-11C illustrate cross-sectional side views of the IC die 900 of FIG. 9 in fabrication stages 1100A-1100C for forming the DTCs 908. FIG. 11A is an illustration of a substrate 1102 at the fabrication stage 1100A in which circuits 1104 are formed in circuit areas 1106 of a semiconductor layer 1108 on the substrate 1102. The circuits 1104 include at least one power connection 1110P and at least one ground connection 1110G. The substrate 1102 may include optional TSVs 1112, which may be employed for transmitting supply voltage, ground voltage, and other signals. For example, one of the TSVs 1112 may be coupled to the power connection 1110P and another one of the TSVs 1112 may be coupled to the ground connection 1110G to provide supply voltage and ground voltage to the circuits 1104 from another die in a die-stack or from a module or carrier to which an IC die including the substrate 1102 is coupled. The substrate 1102 includes non-circuit areas 1114 between the circuit areas 1106, in which no circuits 1104 are formed in the semiconductor layer 1108. The non-circuit areas 1114 in FIG. 11A include an ILD 1116 or passivation layer disposed on the substrate 1102.

FIGS. 11B and 11C illustrate forming DTCs 1118 in the substrate 1102 between the circuit areas 1106. In particular, FIG. 11B illustrates fabrication stage 1100B in which at least one trench 1120 is formed through the ILD 1116 and into the substrate 1102 in the non-circuit areas 1114. The trenches 1120 have a depth in the range of 3 μm to 5 μm. FIG. 11C illustrates fabrication stage 1100C in which DTCs 1118 are formed in the trenches 1120. Forming the DTCs 1118 includes forming a first metal plate 1122 on side surfaces 1124 and a bottom surface 1126 of the at least one trench 1120. Forming the DTCs 1118 also includes forming a dielectric layer 1128 on the first metal plate 1122 and forming a second metal plate 1130 on the dielectric layer 1128. As an example, the first metal plate 1122 may be coupled to a first one of the TSVs 1112 configured to be coupled to a VDD and the second metal plate 1130 may be coupled to a second one of the TSVs 1112 configured to be coupled to a VSS.

Figure 12:
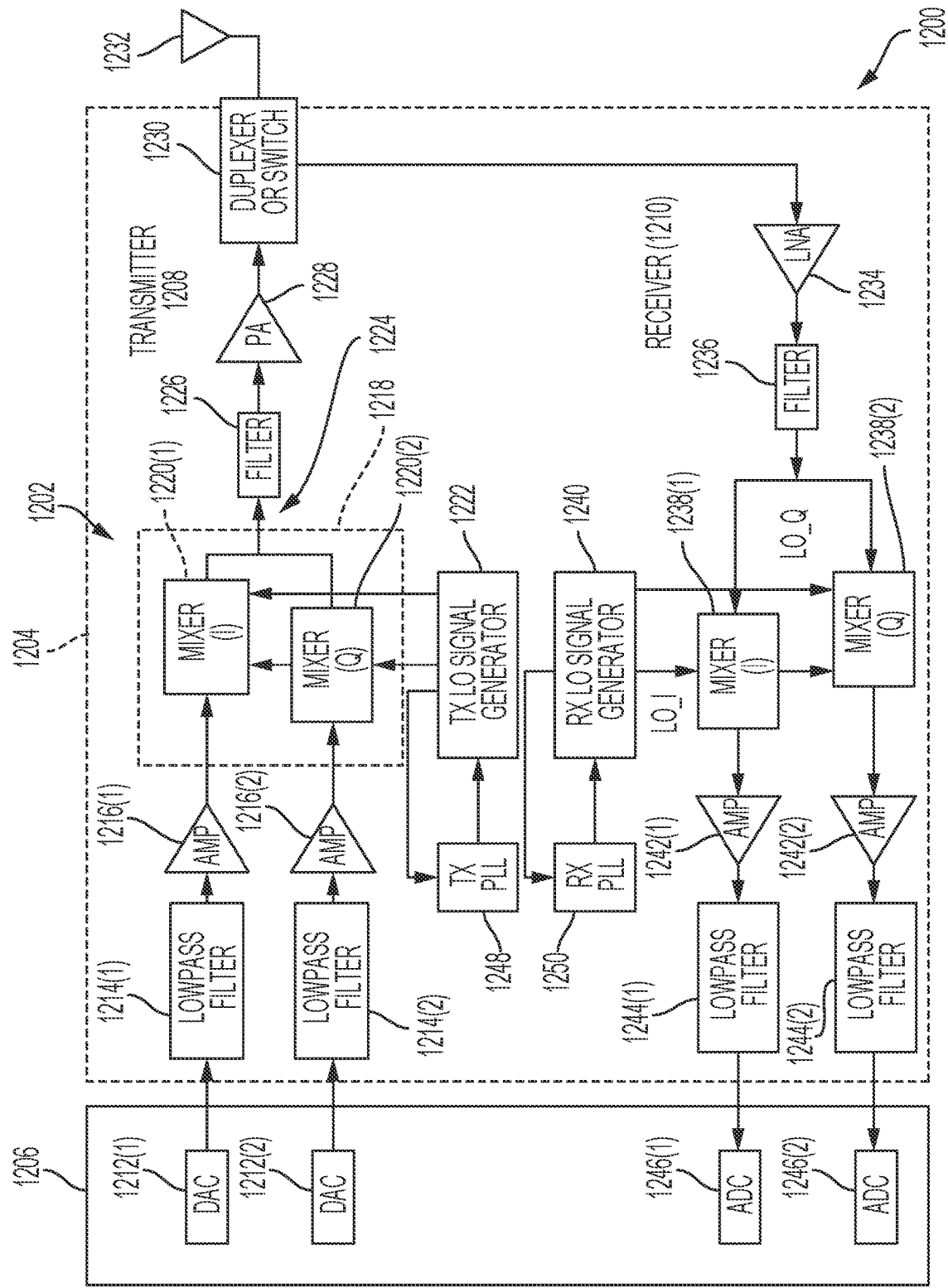
FIG. 12 is a block diagram of an exemplary wireless communications device that includes a radio-frequency (RF) module including the IC dies including DTCs disposed in an ILM for reduced voltage droops and spikes as illustrated in FIGS. 3, 4, and 7-9.

FIG. 12 illustrates an exemplary wireless communications device 1200 that includes radio-frequency (RF) components formed from one or more ICs 1202, wherein any of the ICs 1202 can include exemplary IC dies including DTCs in the ILM, circuits in a semiconductor layer, and metal interconnect layers between the LLM and the semiconductor layer for reducing voltage droop and spikes, as illustrated in any of FIGS. 3 and 7-9, and according to any of the aspects disclosed herein. The wireless communications device 1200 may include or be provided in any of the above-referenced devices, as examples. As shown in FIG. 12, the wireless communications device 1200 includes a transceiver 1204 and a data processor 1206. The data processor 1206 may include a memory to store data and program codes. The transceiver 1204 includes a transmitter 1208 and a receiver 1210 that support bi-directional communications. In general, the wireless communications device 1200 may include any number of transmitters 1208 and/or receivers 1210 for any number of communication systems and frequency bands. All or a portion of the transceiver 1204 may be implemented on one or more analog ICs, RFICs, mixed-signal ICs, etc.

The transmitter 1208 or the receiver 1210 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 1200 in FIG. 12, the transmitter 1208 and the receiver 1210 are implemented with the direct-conversion architecture.

In the transmit path, the data processor 1206 processes data to be transmitted and provides I and Q analog output signals to the transmitter 1208. In the exemplary wireless communications device 1200, the data processor 1206 includes digital-to-analog converters (DACs) 1212(1), 1212(2) for converting digital signals generated by the data processor 1206 into the I and Q analog output signals, e.g., I and Q output currents, for further processing.

Within the transmitter 1208, lowpass filters 1214(1), 1214(2) filter the I and Q analog output signals, respectively, to remove undesired signals caused by the prior digital-to-analog conversion. Amplifiers (AMPs) 1216(1), 1216(2) amplify the signals from the lowpass filters 1214(1), 1214(2), respectively, and provide I and Q baseband signals. An upconverter 1218 upconverts the I and Q baseband signals with I and Q transmit (TX) local oscillator (LO) signals from a TX LO signal generator 1222 through mixers 1220(1), 1220(2) to provide an upconverted signal 1224. A filter 1226 filters the upconverted signal 1224 to remove undesired signals caused by the frequency upconversion as well as noise in a receive frequency band. A power amplifier (PA) 1228 amplifies the upconverted signal 1224 from the filter 1226 to obtain the desired output power level and provides a transmit RF signal. The transmit RF signal is routed through a duplexer or switch 1230 and transmitted via an antenna 1232.

In the receive path, the antenna 1232 receives signals transmitted by base stations and provides a received RF signal, which is routed through the duplexer or switch 1230 and provided to a low noise amplifier (LNA) 1234. The duplexer or switch 1230 is designed to operate with a specific receive (RX)-to-TX duplexer frequency separation, such that RX signals are isolated from TX signals. The received RF signal is amplified by the LNA 1234 and filtered by a filter 1236 to obtain a desired RF input signal. Down-conversion mixers 1238(1), 1238(2) mix the output of the filter 1236 with I and Q RX LO signals (i.e., LO_I and LO_Q) from an RX LO signal generator 1240 to generate I and Q baseband signals. The I and Q baseband signals are amplified by AMPs 1242(1), 1242(2) and further filtered by lowpass filters 1244(1), 1244(2) to obtain I and Q analog input signals, which are provided to the data processor 1206. In this example, the data processor 1206 includes analog-to-digital converters (ADCs) 1246(1), 1246(2) for converting the analog input signals into digital signals to be further processed by the data processor 1206.

In the wireless communications device 1200 of FIG. 12, the TX LO signal generator 1222 generates the I and Q TX LO signals used for frequency upconversion, while the RX LO signal generator 1240 generates the I and Q RX LO signals used for frequency downconversion. Each LO signal is a periodic signal with a particular fundamental frequency. A TX phase-locked loop (PLL) circuit 1248 receives timing information from the data processor 1206 and generates a control signal used to adjust the frequency and/or phase of the TX LO signals from the TX LO signal generator 1222. Similarly, an RX PLL circuit 1250 receives timing information from the data processor 1206 and generates a control signal used to adjust the frequency and/or phase of the RX LO signals from the RX LO signal generator 1240.

Wireless communications devices 1200 that each include exemplary IC dies including DTCs in the ILM, circuits in a semiconductor layer, and metal interconnect layers between the ILM and the semiconductor layer for reducing voltage droop and spikes, as illustrated in any of FIGS. 3 and 7-9, and according to any of the aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

In this regard, FIG. 13 illustrates an example of a processor-based system 1300 including IC dies including DTCs in the ILM, circuits in a semiconductor layer, and metal interconnect layers between the ILM and the semiconductor layer for reducing voltage droop and spikes, as illustrated in any of FIGS. 3 and 7-9, and according to any aspects disclosed herein. In this example, the processor-based system 1300 includes one or more central processor units (CPUs) 1302, which may also be referred to as CPU or processor cores, each including one or more processors 1304. The CPU(s) 1302 may have cache memory 1306 coupled to the processor(s) 1304 for rapid access to temporarily stored data. As an example, the processor(s) 1304 could include exemplary IC dies including DTCs in the ILM, circuits in a semiconductor layer, and metal interconnect layers between the ILM and the semiconductor layer for reducing voltage droop and spikes, as illustrated in any of FIGS. 3 and 7-9, and according to any aspects disclosed herein. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated in FIG. 13, multiple system buses 1308 could be provided, wherein each system bus 1308 constitutes a different fabric.

Other master and slave devices can be connected to the system bus 1308. As illustrated in FIG. 13, these devices can include a memory system 1312 that includes the memory controller 1310 and one or more memory arrays 1314, one or more input devices 1316, one or more output devices 1318, one or more network interface devices 1320, and one or more display controllers 1322, as examples. Each of the memory system 1312, the one or more input devices 1316, the one or more output devices 1318, the one or more network interface devices 1320, and the one or more display controllers 1322 can include exemplary IC dies including DTCs in the ILM, circuits in a semiconductor layer, and metal interconnect layers between the ILM and the semiconductor layer for reducing voltage droop and spikes, as illustrated in any of FIGS. 3 and 7-9, and according to any of the aspects disclosed herein. The input device(s) 1316 can include any type of input device, including, but not limited to, input keys, switches, voice processors, etc. The output device(s) 1318 can include any type of output device, including, but not limited to, audio, video, other visual indicators, etc. The network interface device(s) 1320 can be any device configured to allow exchange of data to and from a network 1324. The network 1324 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1320 can be configured to support any type of communications protocol desired.

The CPU(s) 1302 may also be configured to access the display controller(s) 1322 over the system bus 1308 to control information sent to one or more displays 1326. The display controller(s) 1322 sends information to the display(s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, a light emitting diode (LED) display, etc. The display controller(s) 1322, display(s) 1326, and/or the video processor(s) 1328 can include an exemplary IC dies including DTCs in the ILM, circuits in a semiconductor layer, and metal interconnect layers between the ILM and the semiconductor layer for reducing voltage droop and spikes, as illustrated in any of FIGS. 3 and 7-9, and according to any of the aspects disclosed herein.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Implementation examples are described in the following numbered clauses:

1. An integrated circuit (IC) die, comprising:
    a semiconductor layer on a substrate;
    a plurality of circuits in the semiconductor layer;
    an inter-layer medium (ILM);
    a plurality of metal layers disposed between the semiconductor layer and the ILM, the plurality of metal layers comprising horizontal metal traces interconnecting circuits of the plurality of circuits;
    a plurality of interconnects extending through the ILM and coupled to the horizontal metal traces; and
    at least one deep trench capacitor (DTC) disposed in the ILM, each of the at least one DTC comprising a first terminal coupled to a first vertical interconnect among the plurality of interconnects and a second terminal coupled to a second vertical interconnect among the plurality of interconnects.

2. The IC die of clause 1, wherein:
    the plurality of circuits in the semiconductor layer are disposed in circuit areas corresponding to respective circuit functions; and
    locations of the at least one DTC disposed in the ILM are independent of the circuit areas.

3. The IC die of clause 1 or clause 2, wherein the first vertical interconnect is configured to couple to a supply voltage and the second vertical interconnect is configured to couple to a ground voltage.

4. The IC die of clause 3, further comprising:
    a passivation layer disposed over the ILM;
    a supply voltage interconnect disposed in the passivation layer, the supply voltage interconnect coupled to the first vertical interconnect; and
    a ground voltage interconnect disposed in the passivation layer, the ground voltage interconnect coupled to the second vertical interconnect.

5. The IC die of any of clause 1 to clause 4, wherein each of the at least one DTC comprises:
    at least one trench in the ILM;
    a first metal plate disposed on side surfaces and a bottom surface of each of the at least one trench;
    a dielectric layer disposed on the first metal plate; and
    a second metal plate disposed on the dielectric layer.

6. The IC die of clause 5, wherein the at least one trench comprises up to ten (10) trenches.

7. The IC die of clause 5 or clause 6, wherein the at least one trench extends in a first direction and is separated from another one of the at least one trench by a separation distance in a second direction.

8. The IC die of clause 7, wherein:
    each trench of the at least one trench comprises a trench width in the second direction and a trench depth in the first direction;
    the trench width is 0.2 micrometers ($\mu$m) to 0.4 $\mu$m; and
    the trench depth is 3 $\mu$m to 5 $\mu$m.

9. The IC die of any of clause 1 to clause 8, wherein a thickness of the ILM is 6 micrometers ($\mu$m) to 10 $\mu$m.

10. The IC die of any of clause 1 to clause 9, further comprising in-substrate DTCs, wherein:
    the plurality of circuits in the semiconductor layer are disposed in function areas corresponding to respective circuit functions; and
    the in-substrate DTCs are disposed between the function areas.

11. The IC die of clause 10, further comprising through-silicon-vias (TSVs) extending vertically through the substrate to a substrate surface opposite to the semiconductor layer, the TSVs coupled to the plurality of metal layers and disposed between the function areas.

12. The IC die of any of clause 1 to clause 11, integrated into a radio-frequency (RF) front end module.

13. The IC die of any of clause 1 to clause 12 integrated into a device selected from the group consisting of a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

14. A method of fabricating an integrated circuit (IC) die, the method comprising:
    forming circuits in a semiconductor layer on a substrate;
    forming at least one metal layer including horizontal metal traces interconnecting the circuits;
    forming an inter-layer medium (ILM) on the at least one metal layer;
    forming a plurality of interconnects extending through the ILM and coupled to the at least one metal layer; and forming a deep trench capacitor (DTC) in the ILM, comprising:
  forming at least one trench in the ILM;
  forming a first metal plate on side surfaces and a bottom surface of the at least one trench, the first metal plate coupled to a first one of the plurality of interconnects;
  forming a dielectric layer on the first metal plate; and
  forming a second metal plate on the dielectric layer, the second metal plate coupled to a second one of the plurality of interconnects.

15. The method of clause 14, further comprising:
  forming the circuits in circuit areas of the semiconductor layer; and
  forming DTCs in the substrate between the circuit areas, comprising:
    forming at least one trench in the substrate; and
    forming a DTC in each of the at least one trench, comprising:
      forming a first metal plate on side surfaces and a bottom surface of the at least one trench, the first metal plate coupled to a supply voltage;
      forming a dielectric layer on the first metal plate; and
      forming a second metal plate on the dielectric layer, the second metal plate coupled to a ground voltage.

16. The method of clause 14 or clause 15, wherein:
  the at least one trench in the ILM has a depth of at least 3 μm in the ILM.

17. The method of any of clause 14 to clause 16, wherein:
  forming the DTC in the ILM further comprises forming the DTC in the ILM at least 1.5 μm away from the substrate.

18. An integrated circuit (IC) package, comprising:
  an IC die, comprising:
    a semiconductor layer on a substrate;
    a plurality of circuits in the semiconductor layer;
    an inter-layer medium (ILM);
    a plurality of metal layers disposed between the semiconductor layer and the ILM, the plurality of metal layers comprising horizontal metal traces configured to interconnect circuits of the plurality of circuits;
    a plurality of interconnects extending vertically through the ILM and coupled to the horizontal metal traces; and
    at least one deep trench capacitor (DTC) disposed in the JIM, each of the at least one DTC comprising a first terminal coupled to a first vertical interconnect among the plurality of interconnects and a second terminal coupled to a second vertical interconnect among the plurality of interconnects;
  a package power contact;
  a package ground contact; and
  a second die comprising:
    a substrate; and
    a plurality of through-silicon-vias (TSVs) extending through the substrate, the plurality of TSVs configured to couple the first vertical interconnect to the package power contact and couple the second vertical interconnect to the package ground contact.

19. The IC package of clause 18, further comprising solder bumps configured to couple the IC die to the second die.

20. The IC package of clause 18, wherein a surface of the IC die is bonded to a surface of the second die.

21. The IC package of any of clause 18 to clause 20, wherein the second die further comprises DTCs disposed in the substrate.

What is claimed is:

1. An integrated circuit (IC) die, comprising:
  a semiconductor layer on a substrate;
  a plurality of circuits in the semiconductor layer;
  an inter-layer medium (ILM);
  a plurality of metal layers disposed between the semiconductor layer and the ILM, the plurality of metal layers comprising horizontal metal traces interconnecting circuits of the plurality of circuits;
  a plurality of interconnects extending through the ILM and coupled to the horizontal metal traces; and
  at least one deep trench capacitor (DTC) disposed in the ILM, each of the at least one DTC comprising a first terminal coupled to a first vertical interconnect among the plurality of interconnects and a second terminal coupled to a second vertical interconnect among the plurality of interconnects.

2. The IC die of claim 1, wherein:
  the plurality of circuits in the semiconductor layer are disposed in circuit areas corresponding to respective circuit functions; and
  locations of the at least one DTC disposed in the ILM are independent of the circuit areas.

3. The IC die of claim 1, wherein the first vertical interconnect is configured to couple to a supply voltage and the second vertical interconnect is configured to couple to a ground voltage.

4. The IC die of claim 3, further comprising:
  a passivation layer disposed over the ILM;
  a supply voltage interconnect disposed in the passivation layer, the supply voltage interconnect coupled to the first vertical interconnect; and
  a ground voltage interconnect disposed in the passivation layer, the ground voltage interconnect coupled to the second vertical interconnect.

5. The IC die of claim 1, wherein each of the at least one DTC comprises:
  at least one trench in the ILM;
  a first metal plate disposed on side surfaces and a bottom surface of each of the at least one trench;
  a dielectric layer disposed on the first metal plate; and
  a second metal plate disposed on the dielectric layer.

6. The IC die of claim 5, wherein the at least one trench comprises up to ten (10) trenches.

7. The IC die of claim 5, wherein the at least one trench extends in a first direction and is separated from another one of the at least one trench by a separation distance in a second direction.

8. The IC die of claim 7, wherein:
  each trench of the at least one trench comprises a trench width in the second direction and a trench depth in the first direction;
  the trench width is 0.2 micrometers (μm) to 0.4 μm; and
  the trench depth is 3 μm to 5 μm.

9. The IC die of claim 1, wherein a thickness of the ILM is 6 micrometers (μm) to 10 μm.

10. The IC die of claim 1, further comprising in-substrate DTCs, wherein:
  the plurality of circuits in the semiconductor layer are disposed in function areas corresponding to respective circuit functions; and the in-substrate DTCs are disposed between the function areas.

11. The IC die of claim 10, further comprising through-silicon-vias (TSVs) extending vertically through the substrate to a substrate surface opposite to the semiconductor layer, the TSVs coupled to the plurality of metal layers and disposed between the function areas.

12. The IC die of claim 1, integrated into a radio-frequency (RF) front end module.

13. The IC die of claim 1 integrated into a device selected from the group consisting of a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

14. A method of fabricating an integrated circuit (IC) die, the method comprising:
  forming circuits in a semiconductor layer on a substrate;
  forming at least one metal layer on the semiconductor layer, the at least one metal layer comprising horizontal metal traces interconnecting the circuits;
  forming an inter-layer medium (ILM) on the at least one metal layer;
  forming a plurality of interconnects extending through the ILM and coupled to the at least one metal layer; and
  forming a deep trench capacitor (DTC) in the ILM, comprising:
    forming a first terminal coupled to a first vertical interconnect among the plurality of interconnects; and
    forming a second terminal coupled to a second vertical interconnect among the plurality of interconnects.

15. The method of claim 14, wherein forming the DTC in the ILM further comprises:
  forming at least one trench in the ILM;
  forming a first metal plate on side surfaces and a bottom surface of the at least one trench;
  forming a dielectric layer on the first metal plate; and
  forming a second metal plate on the dielectric layer.

16. The method of claim 15, further comprising:
  forming the circuits in circuit areas of the semiconductor layer; and
  forming DTCs in the substrate between the circuit areas, comprising:
    forming at least one trench in the substrate; and
    forming a DTC in each of the at least one trench, comprising:
      forming a first metal plate on side surfaces and a bottom surface of the at least one trench, the first metal plate coupled to a supply voltage;
      forming a dielectric layer on the first metal plate; and
      forming a second metal plate on the dielectric layer, the second metal plate coupled to a ground voltage.

17. The method of claim 15, wherein:
the at least one trench in the ILM has a depth of at least 3 μm in the ILM.

18. The method of claim 15, wherein:
forming the DTC in the ILM further comprises forming the DTC in the ILM at least 1.5 μm away from the substrate.

19. An integrated circuit (IC) package, comprising:
an IC die, comprising:
  a semiconductor layer on a substrate;
  a plurality of circuits in the semiconductor layer;
  an inter-layer medium (ILM);
  a plurality of metal layers disposed between the semiconductor layer and the ILM, the plurality of metal layers comprising horizontal metal traces configured to interconnect circuits of the plurality of circuits;
  a plurality of interconnects extending vertically through the ILM and coupled to the horizontal metal traces; and
  at least one deep trench capacitor (DTC) disposed in the ILM, each of the at least one DTC comprising a first terminal coupled to a first vertical interconnect among the plurality of interconnects and a second terminal coupled to a second vertical interconnect among the plurality of interconnects;
a package power contact;
a package ground contact; and
a second die comprising:
  a substrate; and
  a plurality of through-silicon-vias (TSVs) extending through the substrate, the plurality of TSVs configured to couple the first vertical interconnect to the package power contact and couple the second vertical interconnect to the package ground contact.

20. The IC package of claim 19, further comprising solder bumps configured to couple the IC die to the second die.

21. The IC package of claim 19, wherein a surface of the IC die is bonded to a surface of the second die.

22. The IC package of claim 19, wherein the second die further comprises DTCs disposed in the substrate.

* * * * *